United States Patent
Eichler et al.

(10) Patent No.: US 8,837,116 B2
(45) Date of Patent: Sep. 16, 2014

(54) POWER SWITCHGEAR CABINET OF A DEVICE FOR PRODUCING ELECTRIC ENERGY

(71) Applicants: Markus Eichler, Kempen (DE); Hans-Georg Nowak, Möchengladbach (DE); Marianne Hitpaβ, Krefeld (DE)

(72) Inventors: Markus Eichler, Kempen (DE); Hans-Georg Nowak, Möchengladbach (DE); Marianne Hitpaβ, Krefeld (DE)

(73) Assignee: Woodward Kempen GmbH, Kempen (DE)

( * ) Notice: Subject to any disclaimer, the term of this patent is extended or adjusted under 35 U.S.C. 154(b) by 0 days.

(21) Appl. No.: 14/045,435

(22) Filed: Oct. 3, 2013

(65) Prior Publication Data

US 2014/0036418 A1 Feb. 6, 2014

Related U.S. Application Data

(63) Continuation of application No. PCT/EP2012/056220, filed on Apr. 4, 2012.

(30) Foreign Application Priority Data

Apr. 4, 2011 (DE) .......................... 10 2011 001 786

(51) Int. Cl.
*H02B 5/00* (2006.01)
*H05K 7/20* (2006.01)

(52) U.S. Cl.
USPC ........... 361/605; 361/620; 361/621; 361/624; 361/688; 361/690; 361/699; 361/700; 361/701; 290/44

(58) Field of Classification Search
None
See application file for complete search history.

(56) References Cited

U.S. PATENT DOCUMENTS

| | | | | |
|---|---|---|---|---|
| 5,712,779 A * | 1/1998 | Sheppard et al. | ............... | 363/69 |
| 7,061,775 B2 * | 6/2006 | Beihoff et al. | ............... | 361/818 |
| 7,244,524 B2 * | 7/2007 | McCluskey et al. | ............ | 429/9 |
| 7,256,508 B2 * | 8/2007 | Altemark et al. | ............... | 290/44 |
| 7,859,838 B2 | 12/2010 | Pesonen | | |
| 8,013,459 B2 * | 9/2011 | Ito et al. | ........................ | 290/44 |
| 8,018,092 B2 * | 9/2011 | Vicente et al. | ................. | 307/66 |
| 8,450,864 B2 * | 5/2013 | Kawakita et al. | ............ | 290/1 A |
| 8,456,806 B2 * | 6/2013 | Cosley et al. | ................ | 361/622 |
| 2010/0039752 A1 * | 2/2010 | Schmidt et al. | ............... | 361/605 |
| 2012/0306213 A1 * | 12/2012 | Hubbers et al. | ................. | 290/55 |

FOREIGN PATENT DOCUMENTS

| | | |
|---|---|---|
| DE | 44 12 990 A1 | 10/1995 |
| DE | 10 2006 050 289 A1 | 4/2008 |
| DE | 10 2008 034 417 A1 | 10/2009 |
| DE | 10 2008 037 449 A1 | 4/2010 |
| EP | 1 903 848 B1 | 9/2010 |
| WO | 2007/115951 A1 | 10/2007 |
| WO | WO 2010/108928 A1 | 9/2010 |

* cited by examiner

*Primary Examiner* — Boris Chervinsky
(74) *Attorney, Agent, or Firm* — Reinhart Boerner Van Deuren P.C.

(57) ABSTRACT

The invention relates to a power switch cabinet of a device for producing electric energy. The technical object of obtaining optimum scalability and cooling of a power switch cabinet despite little space being required is achieved according to the invention in that the power switch cabinet has a machine connection, a power module and a mains connection, wherein the power module has a machine converter, a mains converter, a direct voltage intermediate circuit and a chopper, and the arrangement of the components substantially corresponds to the direction of the power flow.

17 Claims, 10 Drawing Sheets

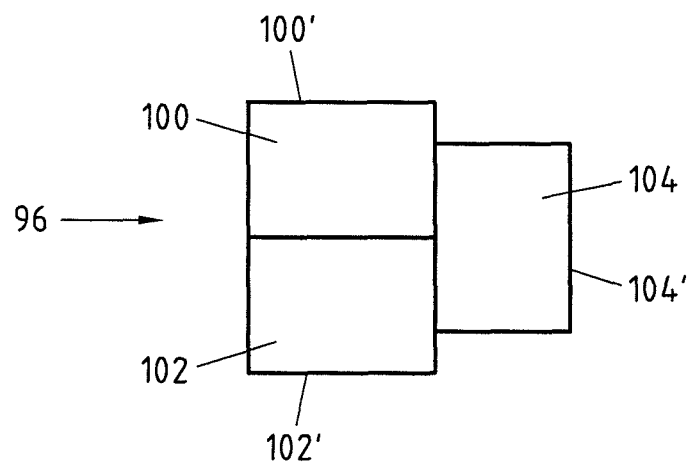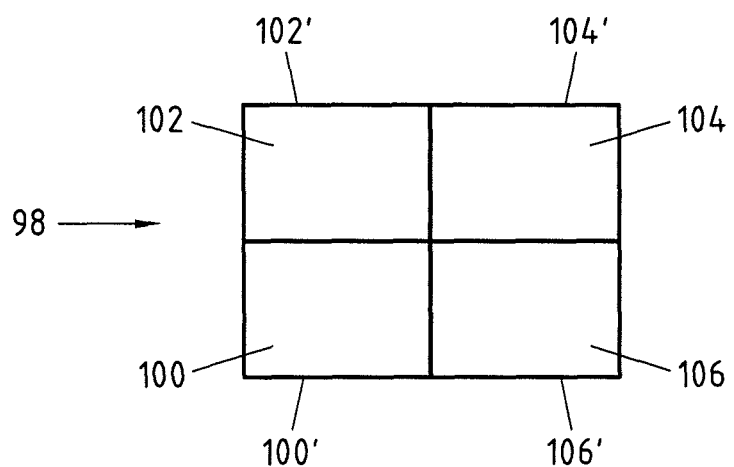
Fig.9

POWER SWITCHGEAR CABINET OF A DEVICE FOR PRODUCING ELECTRIC ENERGY

CROSS-REFERENCE TO RELATED PATENT APPLICATIONS

This patent application is a continuation of pending PCT Application No. PCT/EP2012/056220, filed Apr. 4, 2012, which claims the benefit of German Application No. 102011001786.0, filed Apr. 4, 2011, the entire teachings and disclosure of which are incorporated herein by reference thereto.

FIELD OF THE INVENTION

The invention relates to a power switch cabinet of a device for producing electric energy.

BACKGROUND OF THE INVENTION

Arranging electronic components, such as converters or filters, in particular devices for producing electric energy, in power switch cabinets is known from the prior art. Wind turbines are often fitted with double-fed asynchronous generators, since in this way only part of the output has to be transported via the converters of the turbine. At speeds below the synchronous speed of the generator the efficiency of the turbine drops, however. Therefore synchronous generators with full-power converters are increasingly being used. With these systems, however, all the power to be fed out to the mains passes through a single converter, so that this must have a suitably dimensioned and scalable design. Furthermore, because of the high powers required additional challenges are posed by the need for cooling with a simultaneously compact design of the switch cabinet.

With systems that use double-fed asynchronous generators, however, in which only part of the power has to be passed through the converters, ever-more compact designs of the switch cabinet or cabinets are demanded.

Published application EP 1 903 848 B1 describes a modular frequency converter, where the power electronics part is provided with wheels, and an installation cabinet for receiving the power electronics part. In order to connect the power electronics part to the rest of the frequency converter, complicated and costly connectors are required. In addition the electrical power is initially fed upwards in the installation cabinet via a cable through the power electronics part, in order then to supply the power electronics part downwards again and the rest of the frequency converter upwards. The result of this is complicated cabling and a high space requirement.

Published application U.S. Pat. No. 7,859,838 B2 relates to an arrangement for positioning a converter or frequency converter in a switch cabinet. Here the frame of the switch cabinet has a modular design so that the components of the frequency converter can be installed in the switch cabinet modules before the switch cabinet is taken to its place of use. The disadvantage of this, however, is that the individual components such as breakers, fuses, inverters, braking resistors and frequency converters are distributed across various cabinets, requiring further complicated cabling and cooling with a plurality of cooling devices. Following installation in the fabric, subsequent scalability in-situ is only possible with great effort. In addition, the individual frame modules require a comparatively large amount of space.

SUMMARY OF THE INVENTION

The technical object for this invention is therefore to obtain optimum scalability and cooling of a power switch cabinet despite little space being required.

The technical object is achieved according to the invention in that the power switch cabinet has a machine connection, a power module and a mains connection, wherein the power module has a machine converter, a mains converter, a direct voltage intermediate circuit and a chopper, and the arrangement of the components substantially corresponds to the direction of the power flow.

The fact that the components are substantially arranged in the direction of the power flow means that the components are arranged in the sequence in which power is transported through them, substantially in series. Here, in the case of supersynchronous operation of a double-fed asynchronous generator, or generator operation of a synchronous machine, the power is fed in via the machine connection on one side of the power switch cabinet and fed out via the mains connection on the opposite side. The components are thus arranged in the sequence in which the power is transported via them, increasingly further away from the connection via which the power is fed in, remotely at one end of the power switch cabinet and increasingly nearer to the connection via which the power is fed out, at the second end of the power switch cabinet. Here the direct voltage intermediate circuit with the intermediate capacitors can extend from the machine converter as far as the mains converter.

The wording by which the arrangement of the components "substantially" corresponds to the direction of the power flow, takes account of the fact that the individual components have a certain geometrical expanse and a quite small proportion of one component can overlap with another component in the direction of the power flow, provided that the one component is mostly positioned nearer to or further from one end of the power switch cabinet than the other.

The components can for example be arranged in the vertical direction with a power flow from top to bottom or from bottom to top. A horizontal arrangement from left to right, right to left, front to back or back to front is also conceivable.

Through the arrangement of the components according to the invention no anti-parallel power flows arise, thus no looping or back and forth power flow, resulting in a substantially simplified design of the power switch cabinet and a low space requirement. For, through the arrangement according to the invention of the components in the direction of the power flow, a part of the path within the power switch cabinet can be bridged by the components themselves, so that the shortest connection paths and cablings are achieved with minimal connection paths between components. At the same time, optimum scalability is provided by the easy to access power modules and also, by the compact design on the one hand and the arrangement in the direction of the power flow on the other, the cooling of the components is simplified.

The provision of these components according to the invention in the power switch cabinet and the way that these interact allows optimum scalability of a device for producing electric energy. For substantially, independent power switch cabinets are provided with which in the simplest manner by means of adapting the number of power switch cabinets or by adapting the type and/or number of electronic power switches the power can be scaled.

As a result of the machine and mains connections provided in the power switch cabinet, and the power module, which apart from the mains and machine converters also has a chopper for short-circuiting the respective intermediate circuit, it is possible to arrange the components in such a way that only minimal connection paths between the individual components result. These short connection paths lead on the one hand to a high power density and thus to a very compact arrangement and on the other as a result also to cost savings. The choice of components which the power switch cabinets have also allows an optimum power flow to be achieved, since apart from the machine and mains connections no interconnections with other optional power switch cabinets are necessary which would result in complicated crossings of cable paths.

The machine connection of the power switch cabinet or the machine connections of the at least two power switch cabinets is or are connected preferably via further components, such as switches or also a generator connecting cabinet, which can have switches and/or protective elements, to an electrical machine, for example a generator or a motor. If more than one power switch cabinet is provided, the at least two power switch cabinets are connected in parallel. The machine connection is preferably designed as a connecting rail, but other connections, such as cable connections, are also conceivable. Connecting rails are mechanically robust and in a simple manner provide the necessary section for transporting high powers. In addition they allow a simple connection with a similarly large section between two connecting rails. Connecting rails can also be used on the mains side, in particular for parallel connection of the power switch cabinets.

The machine and the mains converters of the power module preferably have electronic power switches, in order to convert alternating current into direct current or vice versa. These electronic switches can for example be diodes, transistors, Integrated Gate Commutated Thyristors (IGCT) or preferably Insulated Gate Bipolar Transistors (IGBT). The latter allow a virtually power-less triggering with above average robustness and a compact design. These electronic power switches are in particular designed so that they can be mounted individually or as a module with a plurality of electronic power switches in or on the power module.

The energetic coupling of two power supply systems electrically connected by the converter at a shared direct voltage level is preferably achieved by means of capacitors which form the direct voltage intermediate circuit.

The provision of a chopper allows, by means of an electronic power switch, electric energy to be converted from a so-called braking resistor into thermal energy and fed out. For the electronic power switch, once again, an IGBT in particular can be considered, although other electronic power switches are also possible. The provision of a chopper in each power switch cabinet is particularly advantageous, since in this way in any direct voltage intermediate circuit energy can be fed out. The choppers can therefore be matched to the respective power of the individual switch cabinet. Also, if the device is expanded, a re-dimensioning of the chopper, as would be necessary for direct voltage intermediate circuits connected in parallel, can be dispensed with. In addition safety measures can be dispensed with because of the limited energy to be fed out via the chopper. Essentially the chopper can for example by means of cable connections be positioned anywhere in the power switch cabinet. It is particularly advantageous, however, if the chopper is arranged between the mains and the machine converters on a direct current busbar that includes the capacitors of the direct voltage intermediate circuit. In this way a particularly short, symmetrical and direct connection to the direct voltage intermediate circuit is achieved, which has a positive effect on the compactness of the power switch cabinet and allows an even thermal loading of the capacitors. Furthermore, it is possible to fit the electronic power switches and the resistor of the chopper as a common unit, or also, if the design of the resistor does not allow this, to mount the resistor physically separately from the power switch.

When a direct current busbar is used by means of two conductor levels with insulation between them, the direct voltage intermediate circuit can be easily created with very low inductance. This results in a particularly compact design of the power module. For three-level converters a third direct voltage conductor level can be suitably provided for in the direct current busbar, so that without changing the mechanical construction of the power switch cabinets a switch cabinet arrangement can be provided for both low voltage and medium voltage operation.

The power module with mains converter, direct voltage intermediate circuit, chopper and machine converter is connected via the two converters preferably via copper rails with the mains and/or machine connections of the switch cabinet. However, other components can also be present between the power module and the mains and machine connections, which are likewise connected via copper rails to the power module. Copper rails allow an electrical connection with a particularly low loss. However, it is also conceivable to provide cable connections which are designed with a correspondingly low loss.

In this way, to the greatest possible extent, a modular design of the power switch cabinet components is achieved, so that the exchange of individual defective components can be performed without further aids.

A power switch cabinet is preferably designed for powers of typically up to 1 MW, wherein both low voltage of up to 1 kV and medium voltages of up to 30 kV can be used. Higher powers per power switch cabinet are also conceivable, however. Scaling of the power of the switch cabinets can for example on the one hand take place by an adaptation of the type and/or number of electronic power switches and/or on the other particularly easily by the provision of a different number of power switch cabinets according to the invention.

All in all with a switch cabinet according to the invention not only can optimum scalability and cooling of a power switch cabinet despite little space being required be achieved, but a cost-saving construction with minimal connection paths between the components and as a result with an optimal power flow and high power densities can be achieved.

According to one configuration of the switch cabinet according to the invention, the power switch cabinet has a decentralised control unit. The provision of a decentralised control unit allows optimisation of flexibility with regard to the installation of the power switch cabinets and the scalability, in particular if more than one power switch cabinet is provided. The individual components of a power switch cabinet do not have to be operated individually, but can all be internally activated by the decentralised control unit. This can preferably communicate with all relevant implemented components, thus all actuators and sensors of the power switch cabinet, but in particular with the power module. Temperature or humidity sensors can also be read out or observed for monitoring purposes. Because of the short signalling paths a decentralised control unit allows the use of simpler electrical data links for example to the drivers of the IGBTs and other sensors and actuators. With long signal paths only the use of fibre optics can be considered because of the strong electromagnetic fault signals. The result of this is that the optical signals frequently have to be converted back into electrical signals. The communication with the components provided in the power switch cabinet is simplified considerably as a result. The decentralised control units can be connected via simple data links with a central control unit. The number of connections and cables necessary is therefore reduced to a minimum. The decentralised control units are preferably designed in such a way that these can communicate via a fibre optic link for example with a central control unit. The decentralised control unit can then for example communicate with other systems, such as other control units. Here a star, ring, series or bus topology of the decentralised control units can be provided for.

A further configuration of the power switch cabinet according to the invention is characterised in that the components are arranged substantially linearly in the sequence machine connection, machine converter, direct voltage intermediate circuit with chopper, mains converter and mains connection. Here the components are arranged in the sequence in an imaginary substantially straight line between the machine connection and the mains connection, in the same way as the power is transported through them, and thus in the sequence machine connection, machine converter, direct voltage intermediate circuit with chopper, mains converter, mains connection. In this way a particularly simple, compact and clear switch cabinet device with minimal connection paths between the components is made possible. The flow of any air cooling is also guided in a particularly efficient manner through the switch cabinet.

For the purposes of the easiest possible accessibility and thermal effects a substantially vertical arrangement of the components is particularly preferred, wherein the arrangement of the components from both the top down and the bottom up can take place according to the stated sequence. With regard to thermal effects and efficient cooling, however, a vertical and preferably linear arrangement from top down has proven to be particularly advantageous.

If more than one power switch cabinet according to the invention, for example in a switch cabinet arrangement, is provided, the power switch cabinets can be electrically connected together via the mains connection and optionally via the machine connection in parallel. The machine connections can be electrically connected to each other in parallel and then connected with the winding of the machine. When a machine with separate windings is used, it is also conceivable that the machine connections are connected electrically isolated with the respective windings.

If as an alternative to the mains parallel connection of the power switch cabinets the power switch cabinets in each case are connected via associated secondary windings of one or a plurality of transformers to the mains, the formation of circular currents between a plurality of power switch cabinets with machine or also mains parallel connections can be prevented. Transformers with a primary and a secondary winding each can be used or also a transformer with one primary and a plurality of secondary windings.

According to a further configuration of the power switch cabinet according to the invention, the power module has a plate-shaped direct current busbar, which on a first side has the power switches and a chopper and on a second side has the capacitors of the direct voltage intermediate circuit.

Through the direct current busbar and the connection of the power switches and the chopper on the one side and the capacitors of the direct voltage intermediate circuit on the other side of the direct current busbar a very space-saving arrangement of the power modules, which accordingly have a high power density, can be achieved. In this way, easy access and thus easy installation and simple maintenance of the electronic power switches are enabled.

The capacitors can in particular have a conductive connection via connection elements of a first spacing with the direct current busbar, while the at least one electronic power switch has a conductive connection via connection elements of a second spacing with the direct current busbar.

The second spacing of the direct current busbar allows the variable connection of one but also of a plurality of electronic power switches to the direct current busbar, thereby allowing simple scalability of the circuit arrangement. Connection elements are preferably formed by contact holes in the respective metal plate of the electrical connection terminal of the direct current busbar, so that the individual capacitors and electronic power switches can have an electrically conductive connection with the direct current busbar. The first spacing and the second spacing can have either an identical design or one that differs for each. The space requirement is in this way further reduced and on top of this the scalability simplified.

A plurality of capacitors connected in parallel, preferably a capacitor bank, is preferably provided, wherein the individual capacitors have an electrically conductive connection via the connection elements arranged in the first spacing with the direct current busbar. The first spacing of the direct current busbar allows a particularly compact arrangement of the capacitors, since the spacing for example can be tailored to the size and space requirement of the capacitors.

The connection elements of the direct current busbar are preferably arranged in the second spacing in such a way that a plurality of electronic power switches can have a conductive electrical connection in an axis-symmetrical arrangement with the direct current busbar. For the connection elements arranged in the second spacing this means that the electrical connection terminals for example allow contact with an electronic power switch rotated through 180 degrees. The axis-symmetrical arrangement of electronic power switches allows a symmetrical design of the circuit arrangement and associated with this a further reduction of the space requirement of the power module and thus of the power switch cabinet as a whole.

By providing an adapter busbar, which at one connecting end is adapted to the electronic power switch and at the other to the second spacing, electronic power switches from different manufacturers and/or of different types can be used.

Of course, a plurality of direct current busbars electrically connected together can be provided within a power switch cabinet, in order to achieve scalability within a power switch cabinet. These can be connected via short copper bars, cables or other busbars laterally in series or back-to-back.

The chopper can be electrically connected either directly with the direct current busbar or via a specific adapter busbar to the direct current busbar. If the chopper is directly connected with the direct current busbar, on the one hand the costs of an adapter busbar are saved. The adapter busbar can however be used in order to arrange the chopper in an application-specific manner at a suitable point of the circuit arrangement, without having to change the direct current busbar. Through the direct connection of the chopper to the direct current busbar, very low leakage inductances are achieved and an even distribution of the currents through the direct current busbar and the capacitors connected to the direct current busbar. In this way an even distribution of heat is achieved, which in turn allows a more compact and easier to cool power switch cabinet. The chopper is preferably arranged between the electronic power switches of the mains converter and the machine converter on one side of the direct current busbar.

According to a further configuration of the power switch cabinet according to the invention, the power switch cabinet has a dU/dt filter. If a plurality of power switch cabinets are provided, the power switch cabinets preferably have one dU/dt filter each. This allows a limitation of voltage gradients. The dU/dt filter is in particular connected upstream of the machine connection, thus between the machine converter and the machine connection, and protects the machine from excessively rapid voltage changes. Because the power switch cabinets have a dU/dt filter, in addition further cables leaving the power switch cabinet are avoided. A dU/dt filter in particular has a filter choke and optionally an RC circuit. The dU/dt filter can be connected via rails, such as copper rails, cables or strands. In this way the modularity of the components is retained and simplified maintenance can be achieved. A sensor for monitoring the temperature of the dU/dt filter can optionally communicate with the decentralised control unit.

The power switch cabinet preferably has a line choke. This serves for decoupling from the mains. The line choke can similarly be connected via bars, such as copper bars, cables or strand. In this way the modularity of the components is retained and simplified maintenance can be achieved. Strand connections in particular allow a flexible coupling to a converter to be achieved, allowing rapid assembly or also the use of line chokes from various manufacturers. A sensor for monitoring the temperature of the line choke can also communicate with the decentralised control unit. With an arrangement of the components in series the line choke is preferably arranged between the mains connection and the power module, or if a cooling device is present, between the mains connection and the cooling device. A substantially vertical arrangement is particularly preferred, because of the thermal effects for more effective cooling, wherein the line choke is arranged below the power module or the cooling device.

Further preference is for the power switch cabinet to have isolators upstream of the mains connections and/or the machine connections, thus arranged between the mains or machine converters and the mains or machine connections for electrical isolation of the power switch cabinet, for example electrical isolators such as contactors, IGBTs or ICTs or also mechanical isolators such as switches or power disconnectors. This allows further simplification of maintenance work, since in this way individual power switch cabinets can be isolated from the power supply system at the mains and/or at the machine. The contactors can for example be electrically connected via short copper connections with the respective connection.

If more than one power switch cabinet is provided in a switch cabinet arrangement and if a switch cabinet arrangement for example has at least partly redundant power switch cabinets, these can actually be connected or disconnected during operation. Maintenance or exchange of defective components can thus be carried out quickly and easily. In addition the efficiency is increased for example when the generator delivers different powers and at lower powers, power switch cabinets can be disconnected. Furthermore, in the event of a defect in one of the power switch cabinets this can be electrically isolated from the others. Thus the system as a whole can continue to be operated at reduced capacity and energy fed into the mains. This is in particular important for offshore wind turbines, since these can only be reached under difficult conditions.

If the power switch cabinet, in addition to the chopper has a further current and/or voltage limiter, sensitive areas of the power switch cabinet can be protected against excessively high currents and/or voltages. The current and/or voltage limiter can in particular be provided at the machine, for example in the area of the machine connection, in order to protect the machine converter and the direct voltage intermediate circuit. For this a so-called crowbar can for example be provided. Different configurations of such a crowbar are known from the relevant prior art. As a function of, for example, a certain voltage in the direct voltage intermediate circuit or a certain current between the generator and the machine converter the crowbar is activated and short-circuits the machine connections. Thus no further current can flow from the generator into the machine converter, so that an increase in the voltage in the direct voltage intermediate circuit can also be excluded.

According to a next configuration of the power switch cabinet according to the invention, this has an emergency power supply. Thus the power supply to the control electronics in particular can be maintained for a certain period, in order for example to allow a controlled shutdown of the power switch cabinets or the device for generation of electric energy. If a decentralised control unit is provided, this in particular can be supplied with the emergency voltage. Control electronics that are required can then be supplied via the decentralised control unit.

Such an uninterruptable power supply (UPS) can be protected by additional devices arranged inside or outside of the power switch cabinet. The disadvantage, however, is that within the power switch cabinet accumulators or batteries are frequently undesirable since these amongst other things take up a lot of space. If such UPS devices are arranged outside of the power switch cabinet, in some circumstances complicated cabling from or within the power switch cabinet is required. Furthermore, the UPS devices can also fail.

Therefore, it is particularly advantageous if the emergency power supply uses the direct voltage intermediate circuit as a voltage source. In generator operation in the power switch cabinet via the direct voltage intermediate circuit energy is continuously transported from the machine converter to the mains converter. Therefore via the direct voltage intermediate circuit an energy storage device can be provided, which can supply control electronics required in an emergency with energy for a limited period. The energy source of the emergency power supply can be connected via voltage converters with the electronics to be supplied. In normal operation the power supply to the control electronics is provided via the auxiliary power supply provided for this purpose. Only where this is unable to deliver sufficient voltage is the voltage supply to the abovementioned components provided via the emergency power supply fed by the direct voltage intermediate circuit. In order to avoid a complicated switchover the two voltage supplies can be advantageously decoupled from one another via diodes.

According to a further configuration of the power switch cabinet according to the invention the power switch cabinet has a cooling device, in particular a heat exchanger. The cooling can take either by air cooling, for example by means of fans, or via a heat exchanger. The heat exchanger preferably uses a coolant, in particular water. As the coolant a water-glycol mixture can also be advantageously used, but any other liquid coolant is conceivable. Preferably, however, both methods are used simultaneously, so that a correspondingly compact design can be achieved. Components which for example allow water cooling, which in general are the electronic power switches of the inverters and of the chopper, the dU/dt filter and the line choke, are connected to a water cooling circuit. With other components such as for example the intermediate capacitors air cooling is advantageous.

According to a further configuration of the power switch cabinet according to the invention the cooling device has a heat pipe. A heat pipe means a heat exchanger, which by means of heat of evaporation of a transport medium provided in the heat pipe, achieves high heat flow densities. The heat pipe can be used to feed out heat from individual components, transport heat within the power switch cabinet and/or to feed out heat from the power switch cabinet, for example from a cooling system provided in the power switch cabinet. Here the transport medium can be transported both by means of gravity and by means of capillary effects.

If the cooling device has at least one fan arranged directly below the capacitors of the direct voltage intermediate circuit, then an even more optimised cooling of the power switch cabinet in combination with the arrangement of the components according to the invention can be achieved. Here the fan generates an air flow, which prevents an accumulation of hot air at the capacitors. If the fan is at the same time connected to an air-water heat exchanger below the fan, then at the same time the heat from the air-water heat exchanger can be fed out. Here the capacitors of the direct voltage intermediate circuit of the power module and the at least one fan are arranged in the rear section of the power switch cabinet, while the power switches of the power module are easily accessible from the front. Thus with a simultaneously compact arrangement of the components sufficient cooling is achieved and scalability of the power switch cabinet continues to be ensured.

Cooling within a power switch cabinet can extend the lifetime of the components, in particular in climatically unfavourable regions, since it allows a hermetic design of the power switch cabinet and contamination of the components with humid, salty or polluted air from the outside is avoided. The power module, that is to say in particular the machine and mains converters and the chopper, the line choke and/or the dU/dt filter are preferably water cooled. Optionally contactors provided on the mains and machine connections can also be air or water cooled.

In a water cooling circuit a preheating device can also be provided, so that at very low ambient temperatures of the power module, in particular the electronic power switches, on the one hand can be preheated to operating temperature and on the other, following operation, condensation on these components can be avoided.

The power switch cabinet is preferably, according to a further configuration, hermetically sealed from the ambient air. In this case the use of heat exchangers is advantageous, in particular an air-water heat exchanger, which passes the heat given off by the components to the water cooling circuit so that the introduction of cooling external air is unnecessary. Through the use of heat exchangers, even without incoming air, sufficient cooling of the components in the power switch cabinets is ensured. If more than one power switch cabinet is provided, the cooling circuits of the power switch cabinets can be interconnected or also operated independently of one another. Because of the various amounts of heat developed by the individual components it is particularly advantageous if the individual components substantially follow a vertical arrangement. In this case heat resulting from natural convection can be evacuated. The cooling device is preferably arranged below the power module, so that the natural convection can be supported. In a water-air heat exchanger an optimum circulation of the cooling air is achieved, which cools the power module, in particular the capacitors of the direct voltage intermediate circuit.

If more than one power cabinet is provided, the power switch cabinets are preferably connected in parallel by means of AC rails. In this way a simple to assemble and at the same time stable parallel connection of individual power switch cabinets can be achieved. The AC rails are preferably made of copper for its conductivity. In the case of three-phase alternating current in a power switch cabinet at least 3-pole rails are provided. The AC rails can be arranged in such a way that the connection to other optional power switch cabinets is possible laterally, backwards and/or upwards. The front side of the power switch cabinets preferably serves for easy installation and maintenance access.

Essentially, however, cables and/or strands are also conceivable for connection of the power switch cabinets.

If more than one power cabinet is provided, the power switch cabinets are preferably arranged laterally in series and/or back to back. In this way a simple power adjustment of the power switch cabinets can be achieved despite their compact arrangement.

The power switch cabinet can be combined in a switch cabinet arrangement with a mains connection switch cabinet having a central control unit. By means of the central control unit the decentralised control units of the one or a plurality of power switch cabinets can be controlled. If a connection between the decentralised control units and the central control unit is created, via the connection in a simple manner each component of the power switch cabinets can be operated. If for example the switch cabinet arrangement is to be extended by a further power switch cabinet, only the mains and machine connection have to be electrically connected and the decentralised control unit and the auxiliary power supply have to be connected. The number of connections and cables necessary is thus reduced to a minimum. Here either a star, ring, series or bus topology of the decentralised control units can be provided for. The use of a separate mains connection switch cabinet also improves the scalability of the switch cabinet arrangement, since in the event of power adjustments this can be exchanged or adapted separately from the power switch cabinets.

The central control unit, however, can be designed such that it can communicate with other systems. Thus various interfaces and buses, such as Ethernet, CANOpen or other digital or analogue inputs and outputs can be provided, in order for example to similarly be able to take account of or influence generator or rotor data.

The mains connection cabinet also serves to connect the one or the plurality of power switch cabinet(s) to the mains.

The mains connection switch cabinet preferably has one or a plurality of mains filters. These serve to limit electrical faults both from and to the mains. Such a mains filter can be built from inductances, capacitors and/or resistors. Because the mains filter is provided in the mains connection cabinet, it is upstream of all power switch cabinets and only a single filter needs to be provided. It is basically also conceivable, however, to integrate mains filters in each case in the power switch cabinet or the power switch cabinets.

The mains connection switch cabinet preferably has an auxiliary voltage supply and/or a mains switch. The auxiliary voltage supply preferably generates a single-phase 230 V alternating voltage from the mains alternating current. Any direct and/or alternating voltages are conceivable, however. It is similarly possible to feed in the auxiliary voltage from outside, so that in this case the auxiliary voltage supply in the mains connection cabinet merely serves as a distribution node for the power switch cabinets. The auxiliary voltage can thus be provided for all power switch cabinets in a simple manner. By means of one or a plurality of mains switches all power switch cabinets can be easily isolated from the mains.

The central control unit and the decentralised control units are preferably designed in such a way that the central control unit and the decentralised control units can be connected together by means of fibre optics. In this way the number of cabled connections required is reduced, further simplifying the installation and scalability. With the use of fibre optics signals fault due to possible high frequency spurious pulses are avoided.

The object set out above is achieved in particular by a device for producing electric energy which has a power switch cabinet according to the invention or a switch cabinet arrangement comprising a power switch cabinet according to the invention. As already stated, by means of a power switch cabinet according to the invention a cost-saving, compact construction with minimal connection paths between the components and as a result an optimal power flow and high power density can be achieved.

This applies in particular for a further developed device according to the invention for producing electric energy, which is designed as a wind turbine with a generator and has a power switch cabinet according to the invention. As indicated above, double-fed asynchronous or synchronous machines can for example be used as generators. If asynchronous generators are used then regularly just one power switch cabinet is necessary since only a part of the power is transported via the converter. Since wind turbines, depending on their size or the wind strength at the place of use generate widely differing powers, the components used and in particular the converters must be adaptable to this power. This is achieved with the power switch cabinet according to the invention in a particularly simple and cost-effective manner by adapting the type and/or number of electronic power switches. Furthermore, the space offered by wind turbines—for example within a tower of a wind turbine—is usually limited, so that the compact design of the individual power switch cabinet and thus also any overall switch cabinet arrangements is advantageous. In particular where synchronous machines are used with full-power converters the entire electrical power is passed through the converters, so that a compact and scalable design with simultaneous optimum cooling is an advantage. Minimal space requirement allows, for example, a back-to-back arrangement of the power switch cabinets, without compromising accessibility and thus the ease of maintenance.

BRIEF DESCRIPTION OF THE DRAWINGS

In the following the invention is explained in more detail using a description of exemplary embodiments together with the drawing. The drawing shows as follows:

FIG. 9 various exemplary embodiments of a switch cabinet arrangement; and

DETAILED DESCRIPTION OF THE INVENTION

Figure 1:
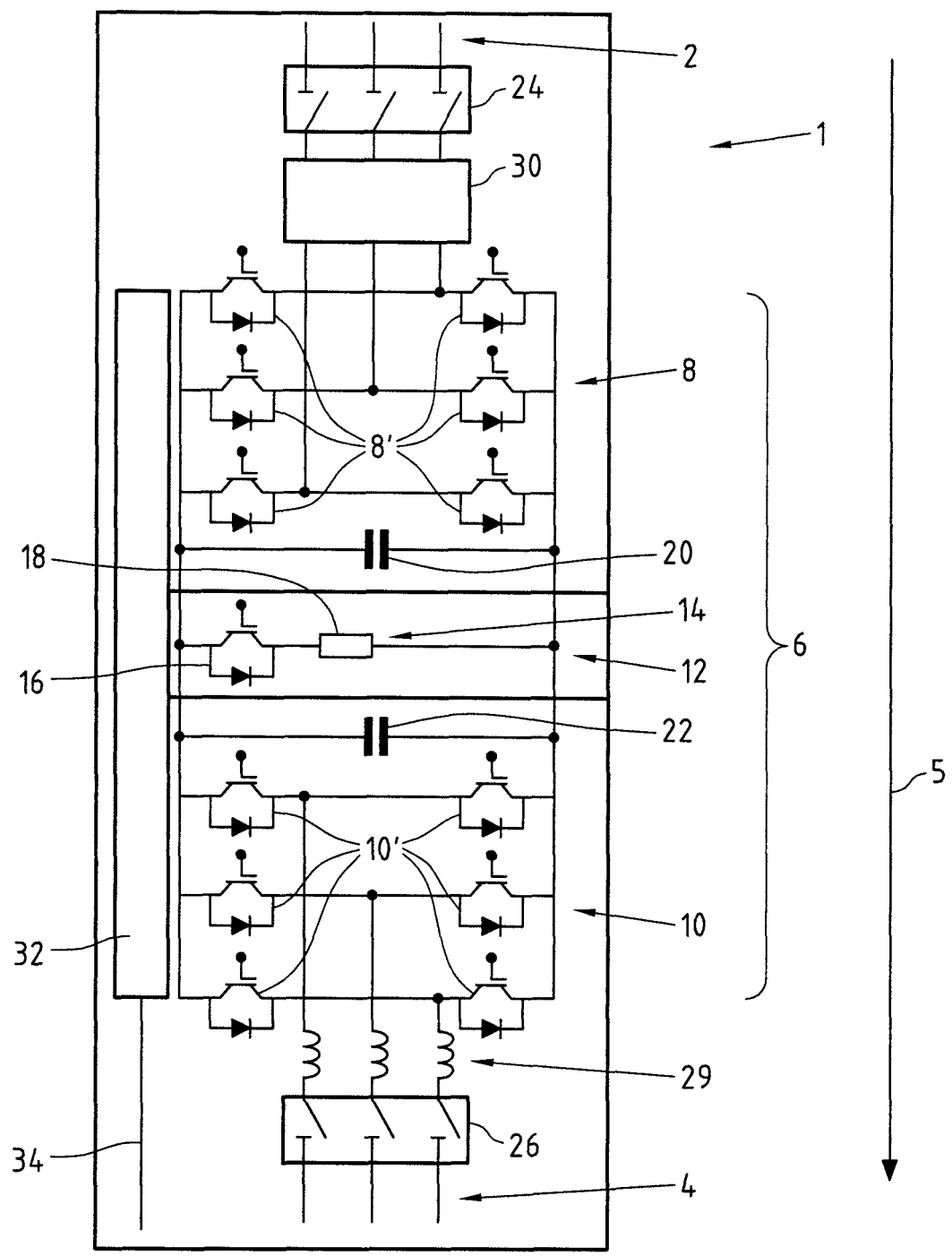
FIG. 1 a schematic in the form of a circuit diagram of the design of an exemplary embodiment of a power switch cabinet according to the invention.

FIG. 1 is a schematic in the form of a circuit diagram of the design of an exemplary embodiment of a power switch cabinet 1. As the circuit diagram shows, the power switch cabinet 1 at a first end has a machine connection 2 and at a second end a mains connection 4. In this exemplary embodiment, both connections 2, 4 have a three-wire design for the provision of three-phase power. These connections 2, 4 can be created using cables or AC rails, preferably copper rails. Here the power is transported from the machine connection 2 at the first end of the switch cabinet 1 in the direction of power flow, shown by the arrow 5, via the components described in the following and connected in series to the mains connection 4 at the second end of the power switch cabinet 1 in a vertical direction from top to bottom.

Via the machine connection 2 a plurality of switch cabinets 1 can be connected in parallel and have an electrically conductive connection with a generator 68, for example a synchronous generator. By means of the mains connection 4 the power switch cabinet 1 has an electrically conductive connection with the mains, for example a power supply system. The at least two power cabinets are preferably connected in parallel via the mains connections 4. Here other components such as switches or filters, in particular a mains connection switch cabinet 72, can also be connected between the mains and the mains connection 2.

Between the connections 2, 4 a power module 6 is arranged. This has a machine converter 8, a mains converter 10, a direct voltage intermediate circuit 12 and a chopper 14. The chopper 14 consists of an electronic power switch 16 and a braking resistor 18. The electronic power switch 16 is in this case an IGBT. The converters 8, 10 have a plurality of electronic power switches in the form of IGBTs 8', 10'. Other electronic power switches can also be used, however. The direct voltage intermediate circuit 12 is indicated by two capacitors 20, 22, which normally consist of a plurality of capacitors connected in parallel as capacitor bank 48.

The power switch cabinet 1 also preferably has two contactors 24, 26, which are upstream of the connections 2, 4. By means of the contactors 24, 26 the entire switch cabinet 1 can be isolated as a unit from both the mains and from the generator 68. This is an advantage in particular for maintenance and repair purposes, installations or in the event of defects. The line choke 29 serves for decoupling of converter and the mains.

To avoid voltage gradients, in particular at the generator, between the machine converter 8 and the contactor 24, a dU/dt filter 30 is preferably arranged. The power switch cabinet 1 also has a decentralised control unit 32. This can communicate with any components of the power switch cabinet 1, but preferably with all actuators and sensors in the power switch cabinet, for example with the converters 8, 10 the chopper 14 and/or the contactors 24, 26. In this way the power switch cabinet 1 also substantially forms a unit, so that a switch cabinet arrangement 64, 96, 98 can be easily adapted to the power of a generator 68 through the provision of a corresponding number of power switch cabinets 1. Here, the decentralised control unit is connected via one, or typically two, fibre optic links 34 with further control units. Other transmission methods using network cables or also cable-free connections are also conceivable, however. The decentralised control unit 32 allows above all the creation of short signalling paths within the power switch cabinet itself, so that here simple electrical connections are possible despite the strong electromagnetic interference fields. In any event, the number of cable connections required to a central control device is reduced to a minimum by the provision of a decentralised control unit 32.

Essentially the actual positioning of the components in a power switch cabinet 1 is not in fact determined by the arrangement of the components in a circuit diagram. However, provision is made for the components to be arranged substantially in the same sequence as in the circuit diagram, thus in the direction of the power flow 5. As can be seen, the components are arranged substantially linearly in the sequence machine connection 2, machine converter 8, direct voltage intermediate circuit 12 with chopper 14, mains converter 10 and mains connection 4.

Figure 2:
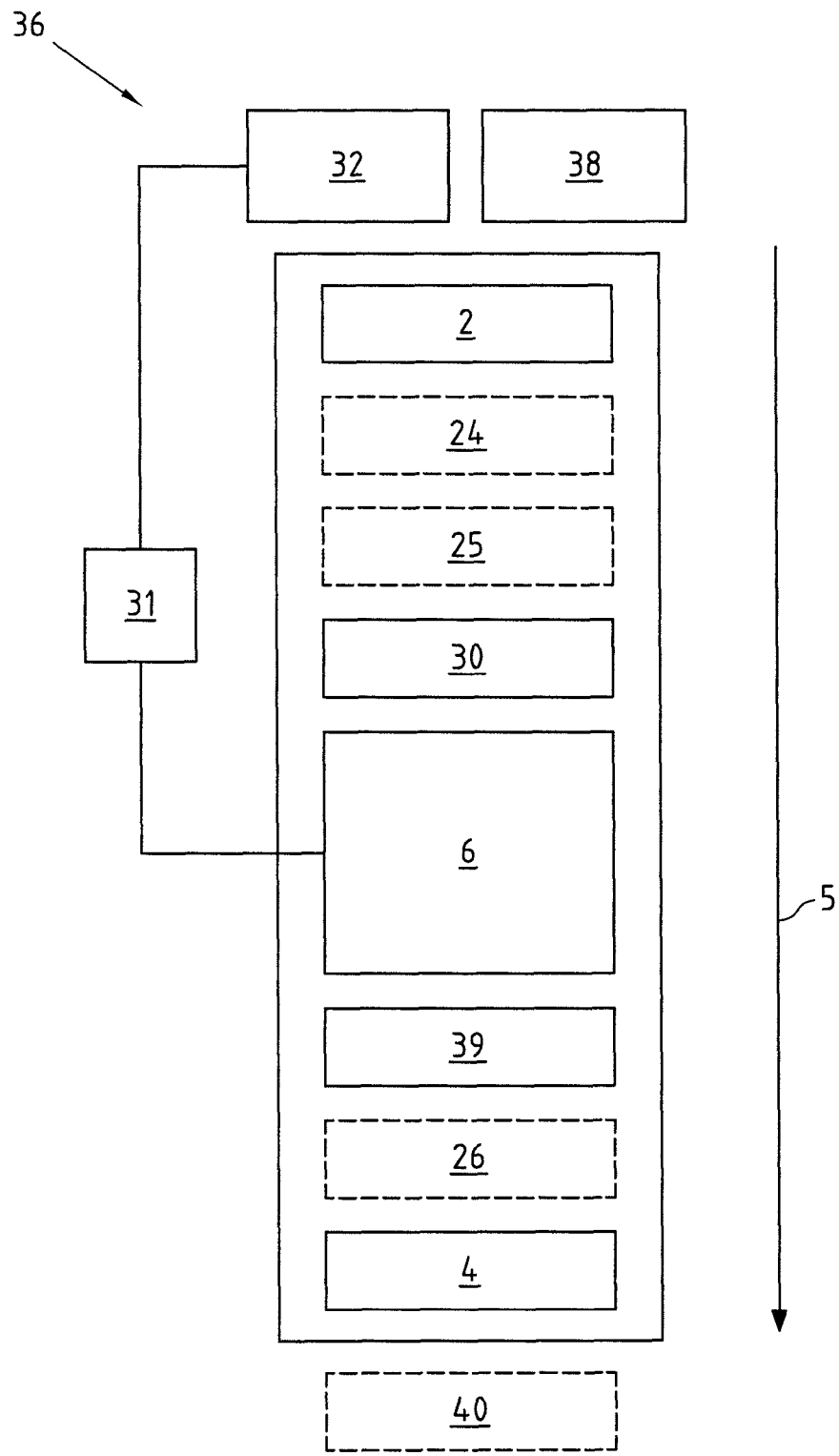
FIG. 2 a schematic in the form of a block diagram of the arrangement of the components of a further exemplary embodiment of a power switch cabinet according to the invention.

FIG. 2 schematically shows the arrangement of the components of a further exemplary embodiment of a power switch cabinet 36 in the form of a block diagram. Above all through the arrangement of the components in the direction of the power flow shown by the arrow 5, substantially in series in the sequence: machine connection 2, optional machine contactor 24, optionally a current and/or voltage limitation device 25, dU/dt filter 30, power module 6, line choke 39, optional mains contactor 26 and mains connection 2, a compact arrangement of the components and at the same time ease of accessibility of the individual components and the possibility of sufficient and effective cooling are achieved. The arrangement can of course be in the reverse sequence. A vertical arrangement of the components as shown in the power switch cabinet 36 is preferred, because of the ease of accessibility and the thermal effects during cooling. Here, the cooling can be assisted by natural convection. Here, a decentralised control unit 32 and an intermediate circuit preloading unit can be flexibly positioned in the power switch cabinet 36. A cooling device 38 also as a rule extends across a plurality of components in the power switch cabinet 36. It is advantageous, however, to provide cooling in the form of an air-water heat exchanger between the power module 6 and the line choke 39. The individual components can be cooled preferably by convection, by using water and air. A mains filter 40 can optionally also be provided in the power switch cabinet 36. The current and/or voltage limitation device 25, which can for example be designed as a crowbar, protects the machine converter 8 from excessive current and the direct voltage intermediate circuit from excessive voltage.

In addition, an emergency power supply 31 is provided, which in an emergency uses the energy stored in the direct voltage intermediate circuit 12 of the power module 6 as a temporary supply to the decentralised control unit 32 so that the required control electronics do not fail.

Figure 3:
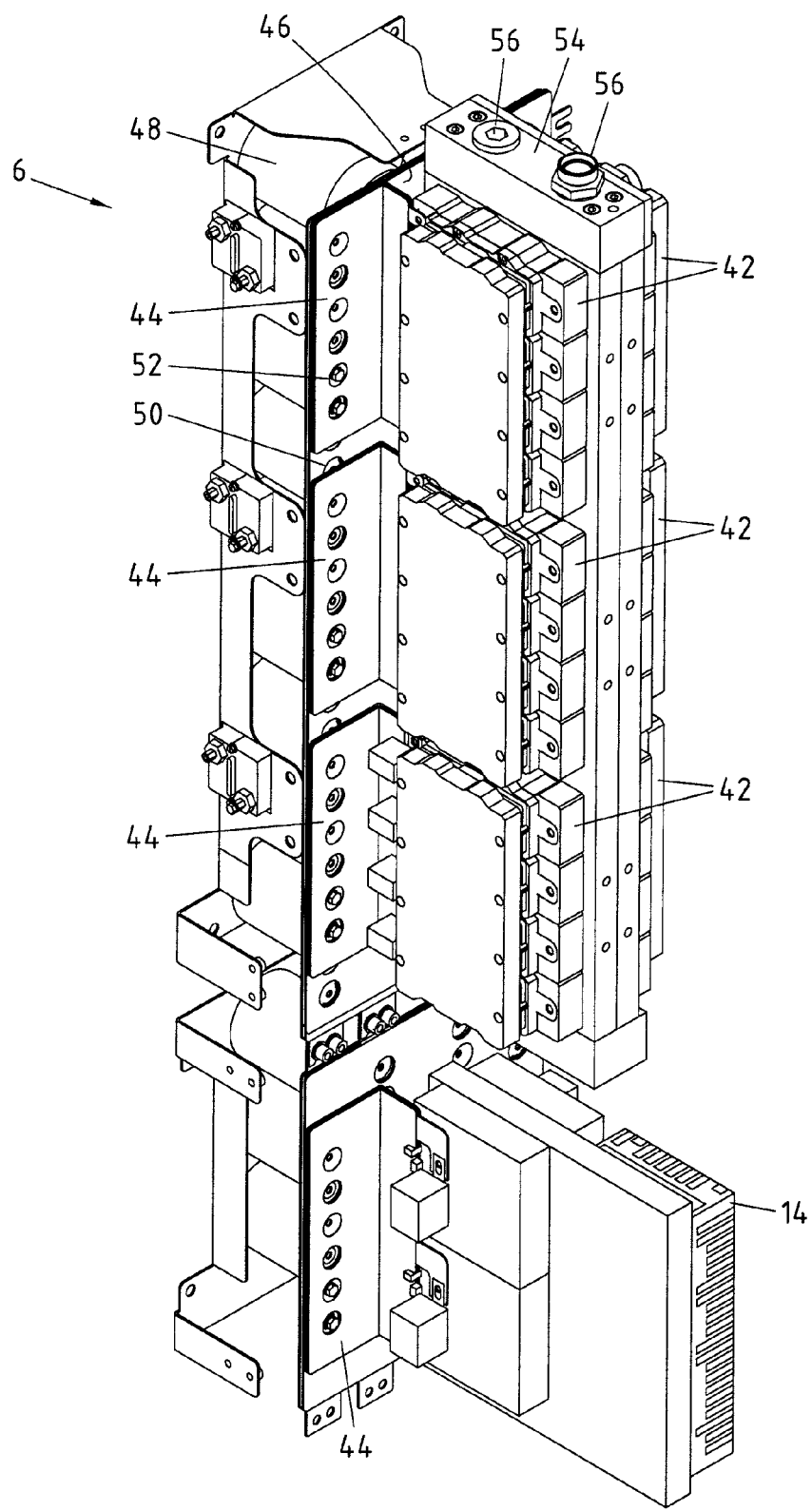
FIG. 3 a perspective representation of an exemplary embodiment of a power module with a chopper.

FIG. 3 then provides a perspective representation of an exemplary embodiment of a power module 6 with chopper 14. A plurality of electronic power switches 42 in the form of IGBTs are connected by means of adapter busbars 44 to a direct current busbar 46. The electronic power switches 42 are all arranged on one side of the direct current busbar 46. On the opposite side of the direct current busbar 46 a capacitor bank 48 is arranged. It can likewise be seen how the capacitor bank 48 via a first spacing (not shown) and the electronic power switches 42 with the adapter busbar 44 via a second spacing 52 are electrically connected with the direct current busbar 46. Rectangular adapter busbars 44 are preferably used, in order to achieve a positioning of the power switch or the chopper outside the plane of the direct current busbar. This arrangement of the power switches guarantees improved cooling of the power switches or also of the chopper.

A chopper 14 is also connected to the direct current busbar 46. The chopper 14 serves to protect the capacitor bank 48 and the electronic power switches 42 from voltage surges. The combination of electronic power switches 42 and an additional chopper 14 arranged on the direct current busbar 46 allows the direct connection of the chopper 14 to the capacitor bank 48. A cabled connection between the direct current busbar 46 and the chopper 14 is thus dispensed with. Since the intermediate circuit voltage is regularly at in excess of 1 000 Volts, this is advantageous both from the safety aspect and with regard to electromagnetic compatibility of the power module 6. There is also a reduction in space requirement.

The power module 6 from FIG. 3 also has a cooling element 54 with coolant connections 56. By arranging the cooling element 54 between the electronic power switches 42 it is possible for these to be effectively cooled by a single cooling element 54 and to have a compact arrangement.

Figure 4:
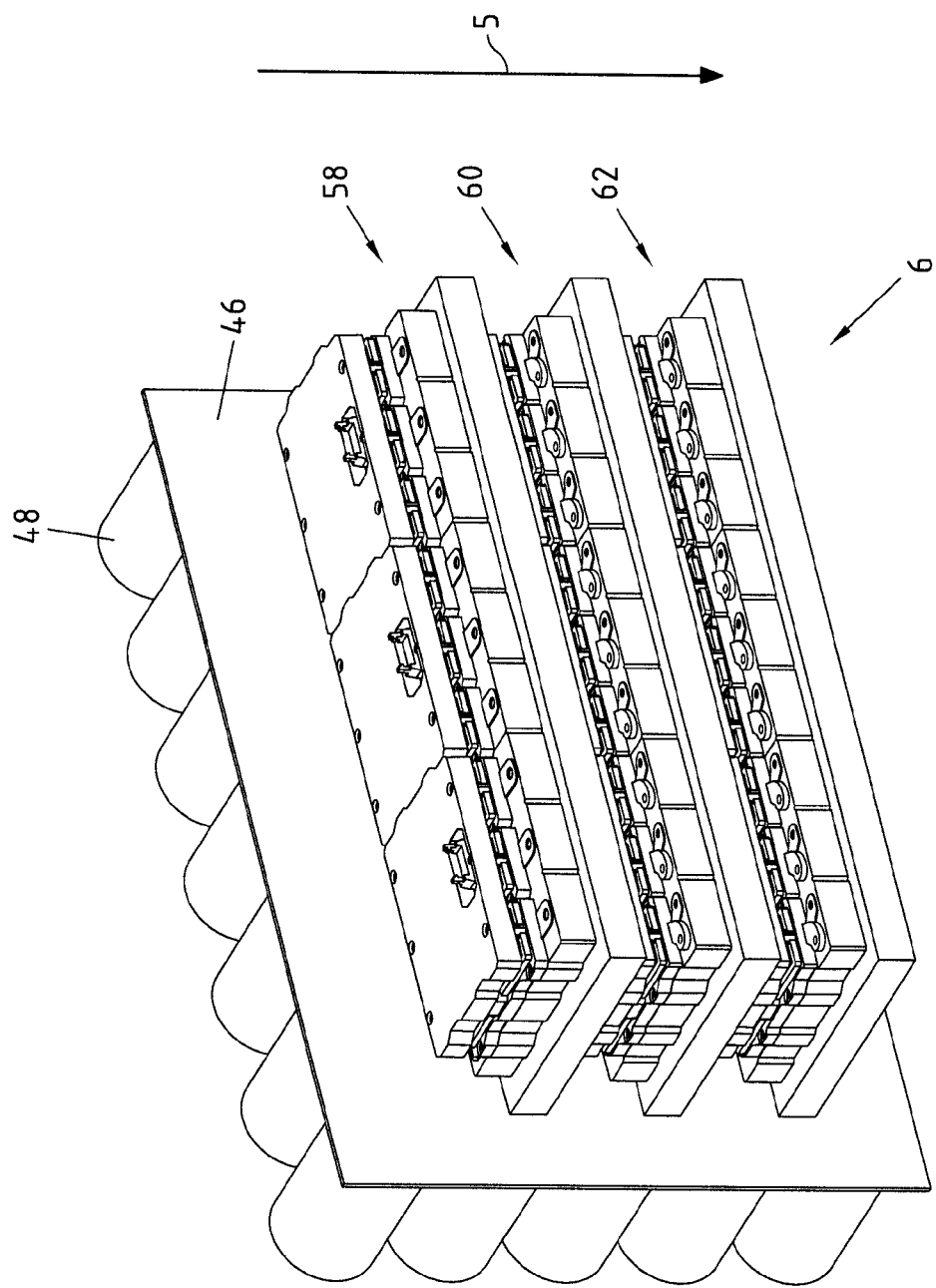
FIG. 4 a perspective representation of a further exemplary embodiment of a power module.

FIG. 4 gives a perspective representation of a further exemplary embodiment of a power module 6. The electronic power switches 42 are combined to form three modules 58, 60, 62 and arranged on the direct current busbar 46. Each of these modules has a cooling element, preferably for water cooling. The capacitor bank 48 is in turn arranged on the opposite side. It is particularly preferred if the modules 58, comprise the electronic power switches 8', 10' of the converters 8, 10, while the middle module 60 comprises the electronic power switch or switches of the chopper 14 and optionally the resistor 18. As can be easily seen, individual modules 58, 60, 62 can be replaced in a simple manner for example if they develop a fault. Furthermore scalability can be achieved very simply by addition or removal of further modules 58, 60, 62. While the module 58 comprises the machine converter 8, the module 62 the mains converter 10 and the module 60 the power switch of the chopper 14 and the resistor 18, in the power module 6 the arrangement of the components in the direction of the power flow, shown by the arrow 5, is also clear. Here the direct voltage intermediate circuit 12 electrically connected in parallel also extends parallel to the modules 58, 60, 62.

Figure 5:
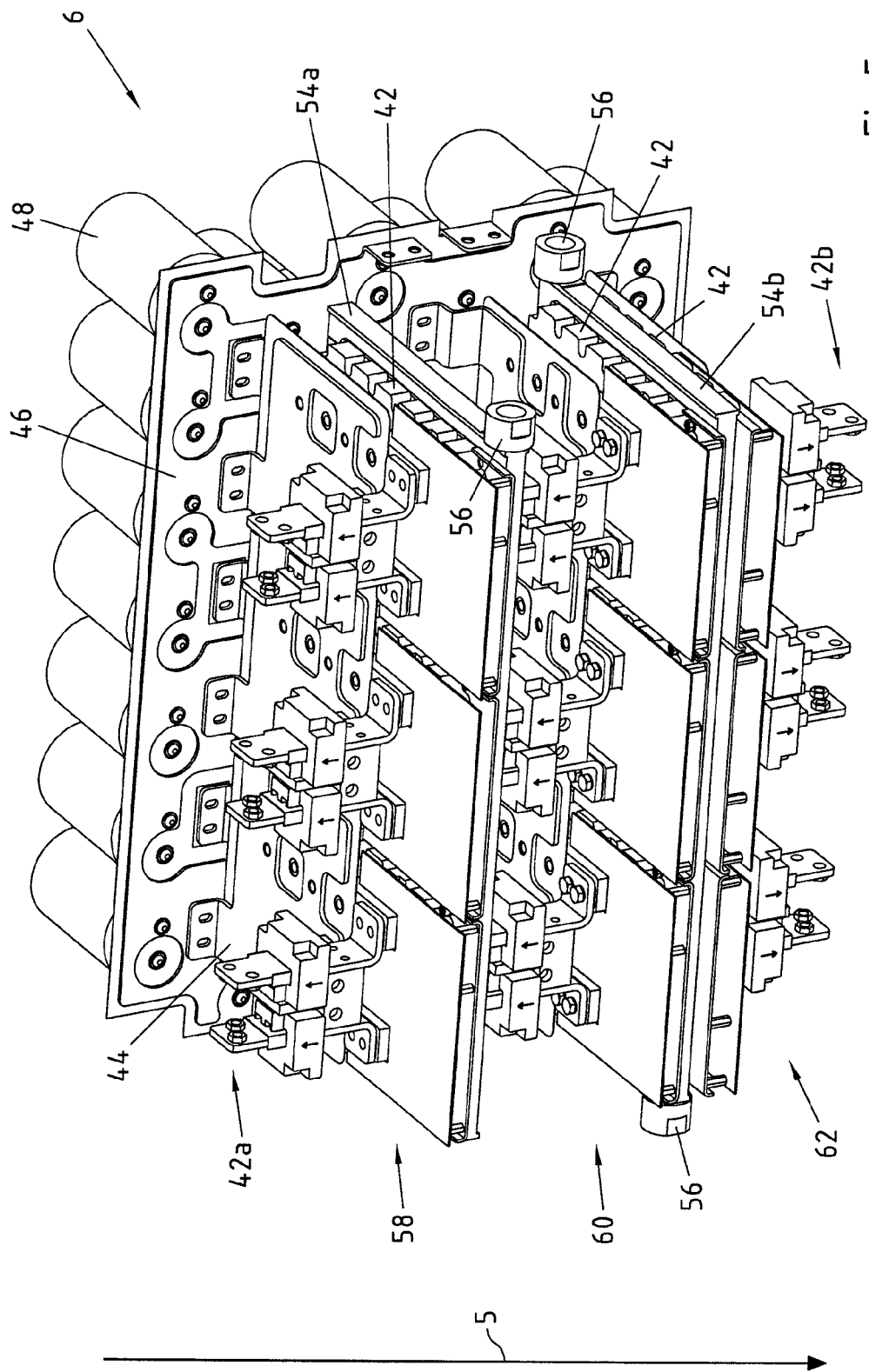
FIG. 5 a perspective representation of a further exemplary embodiment of a power module.

FIG. 5 shows a further exemplary embodiment of a power module 6 for a power switch cabinet according to the invention. The electronic power switches 42, similarly to that shown in FIG. 4, are again combined to form three modules 58, 60, 62 and arranged by means of adapters 44 on the direct current busbar 46. By means of the substantially rectangular adapters, the plate-shaped power switches 42 are arranged substantially vertically on the direct current busbar 46. Below the module 58 a cooling element 54a and between the modules 60 and 62 a cooling element 54b are arranged. The cooling elements are in this example liquid cooling elements with connections 56. The capacitor bank 48 is again arranged on the opposite side of the direct current busbar. It is particularly preferred if the modules 58, 62 comprise the electronic power switches 8', 10' of the converters 8, 10, while the middle module 60 comprises the electronic power switch or switches of the chopper 14 and optionally the resistor 18. For the cooling of the chopper 14, however, water cooling is not absolutely necessary, cooling by means of a cooling plate, for example made of aluminium, being similarly conceivable. The braking resistor of the chopper can for example also be arranged on the still free underside of the cooling plate 54a. Similarly other modules such as resistors of the dU/dt filter or discharge resistors can be arranged on the still free underside of the cooling plate 54a. As can be seen, individual modules 58, 60, can be replaced in a simple manner for example if they develop a fault. Furthermore scalability is very easily possible by addition or removal of further modules 58, 60, 62.

It will also be noted how the modules 58, 60, 62 of the power module 6 from FIG. 5 are arranged in the direction of the power flow, shown by the arrow 5, in this case in the vertical direction. The power switches of the module 58 are connected via the machine connections 42a aligned substantially perpendicular to the power modules, switch the power delivered by the machine and correspondingly feed this into the direct voltage intermediate circuit 12. Energy can be removed from the direct voltage intermediate circuit 12 by means of the power switches 42 of the module 60 arranged vertically below the module 58 and by means of a chopper 14 converted into heat energy. Finally, the power from the direct voltage intermediate circuit 12 can be fed out via the power switches 42 of the module 62, again arranged below the module 60, by means of the mains connections 42b aligned substantially perpendicular to the power modules. As can be seen, a substantial proportion of the connection paths between the individual components of the power module 6 is bridged by the arrangement of the individual components along the power flow.

Figure 6:
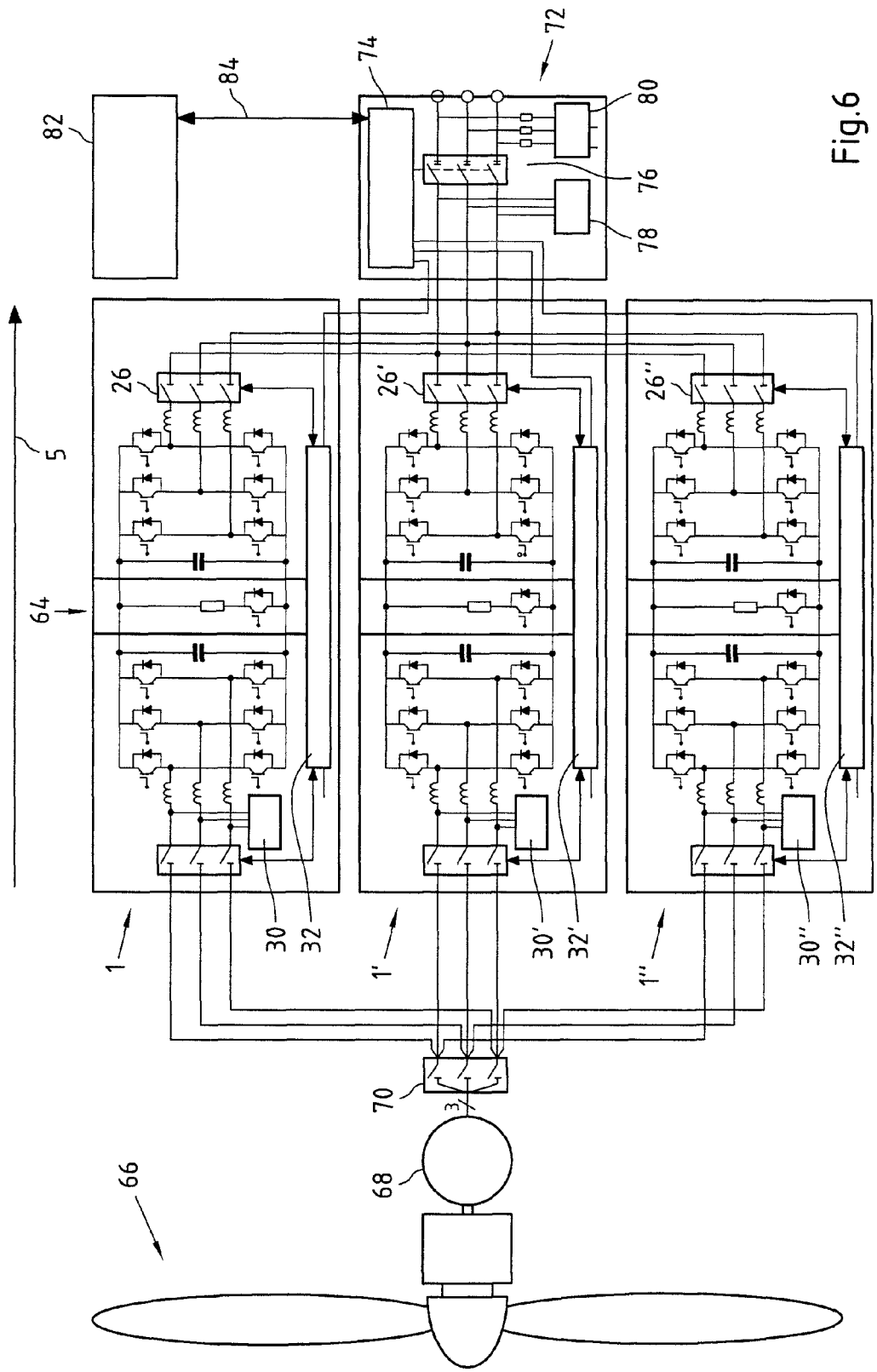
FIG. 6 a schematic in the form of a circuit diagram of the design of an exemplary embodiment of a switch cabinet arrangement of a wind turbine.

FIG. 6 schematically shows the design of an exemplary embodiment of a switch cabinet arrangement 64 in the form of a circuit diagram. This comprises the power switch cabinet 1 from FIG. 1 and two other switch cabinets 1', 1" preferably of the same design. The power switch cabinets 1, 1', 1" are connected in parallel. It is also conceivable for the power switch cabinets 1, 1', 1" to be provided with a different layout in a switch cabinet arrangement 64, in order if necessary to achieve better power adaptation. It is also conceivable to provide just two or more than three power switch cabinets. Here the arrangement of the components in the individual power switch cabinets, as already shown in FIG. 1, is in each case in the direction of the power flow 5, so that in this case three parallel power flows result in the three power switch cabinets 1, 1', 1". A rotor 66 drives a permanent magnet excited synchronous generator 68. This has an electrically conductive connection, via a generator switch 70, which can optionally be provided in a generator connection cabinet (not shown), with the power switch cabinets 1, 1', 1".

The power switch cabinets 1, 1', 1" are electrically connected by mains connections with a mains connection cabinet 72. This has a central control unit 74, a mains switch 76, a mains filter 78 and an auxiliary power supply 80. The mains filter 78 is in this way upstream of all power switch cabinets 1, 1', 1" and does not have to be implemented separately in each power switch cabinet. It is possible, however, to provide the mains filter 78 in the power switch cabinets 1, 1', 1". The mains switch 76, for rapid and simple isolation of the power switch cabinets 1, 1', 1" from the mains can for example also be an electronic power switch. It is easy to see that, apart from the conductive connections or mains connections 26, 26', 26" with the mains connection cabinet 72, only one connection between the decentralised control units 32, 32', 32" and the central control unit 74 and one connection (not shown) between the auxiliary voltage supply unit 80 and the power switch cabinets 1, 1', 1" is necessary. This means that less effort is required for installation and optimal scalability of the switch cabinet arrangement 64 is achieved. The central controller 72 in this exemplary embodiment is connected with a wind turbine controller 82 via a data link 84. The wind turbine controller 82 can for example make data available on the generator 68 or rotor 66 or influence these or specify power and current setpoints. As the data link 84 various interfaces and buses, such as Ethernet, CANOpen or other digital or analogue inputs and outputs can be provided.

Figure 7:
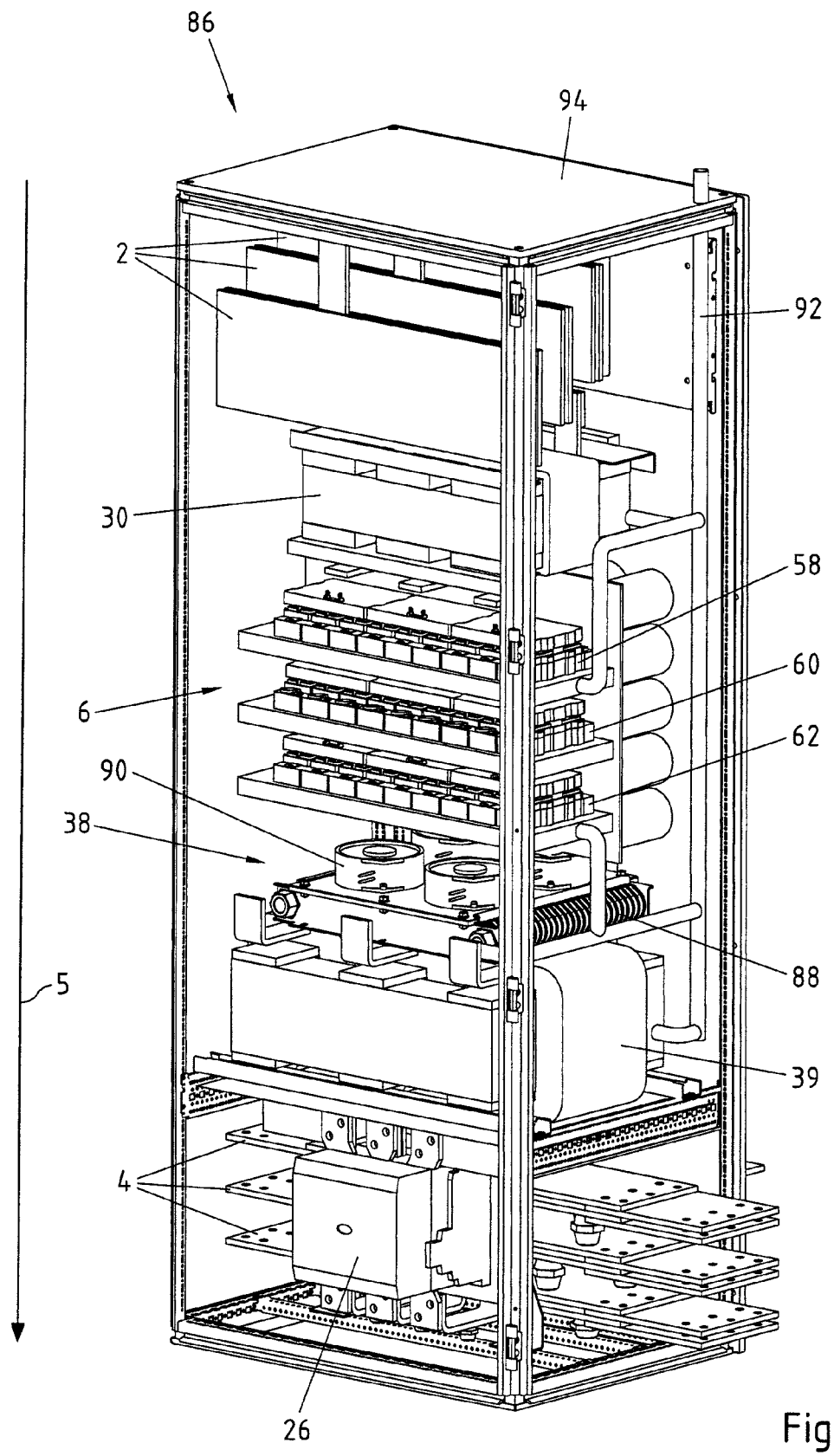
FIG. 7 a perspective representation of a further exemplary embodiment of a power switch cabinet according to the invention.

FIG. 7 is a perspective representation of a further exemplary embodiment of a power switch cabinet 86. The power switch cabinet 86 has AC rails as the mains and machine connections 2 and 4. These are designed for three-phase alternating current. The AC rails for the mains connection 4 are arranged horizontally one above the other, while the AC rails for the machine connection 2 are arranged vertically one behind the other. Other arrangements are similarly conceivable, however. A contactor 26 is arranged in the area of the mains connection 4.

Above the mains connection 4 a line choke 39 is incorporated into the power switch cabinet 86. By means of this a cooling element is built in, which has an air-water heat exchanger 88 and a fan 90. The line choke 39 can be cooled in particular by the water cooling circuit 92.

Above the fan 90 the power module 6 from FIG. 4 is arranged. However, other embodiments of the power module can also be arranged here. By means of this arrangement the capacitor bank 48 of the power module 6 in particular can be effectively cooled by the fan 90. Here the modules 58, 60, 62 are cooled by the water cooling circuit 92, or prior to coming into operation are optionally heated to bring them to operating temperature.

Above the power module 6, the dU/dt filter 30 is arranged, which similarly is connected to the water cooling circuit 92.

Finally, above the dU/dt filter 30 the machine connection 2 in the form of AC rails is arranged.

It is easy to see how the individual components in the power switch cabinet 86 are arranged in the frame 94 substantially in series in a vertical arrangement from top to bottom, so that the arrangement of the components corresponds to the direction of the power flow, shown by the arrow 5. A substantially horizontal arrangement or an arrangement in the reverse sequence is of course also conceivable. Through the arrangement in the sequence shown, which substantially corresponds to the direction of the power flow, the components can be arranged in the power switch cabinet 86 in a very compact and easily accessible manner, whilst at the same time being adequately cooled.

Figure 8:
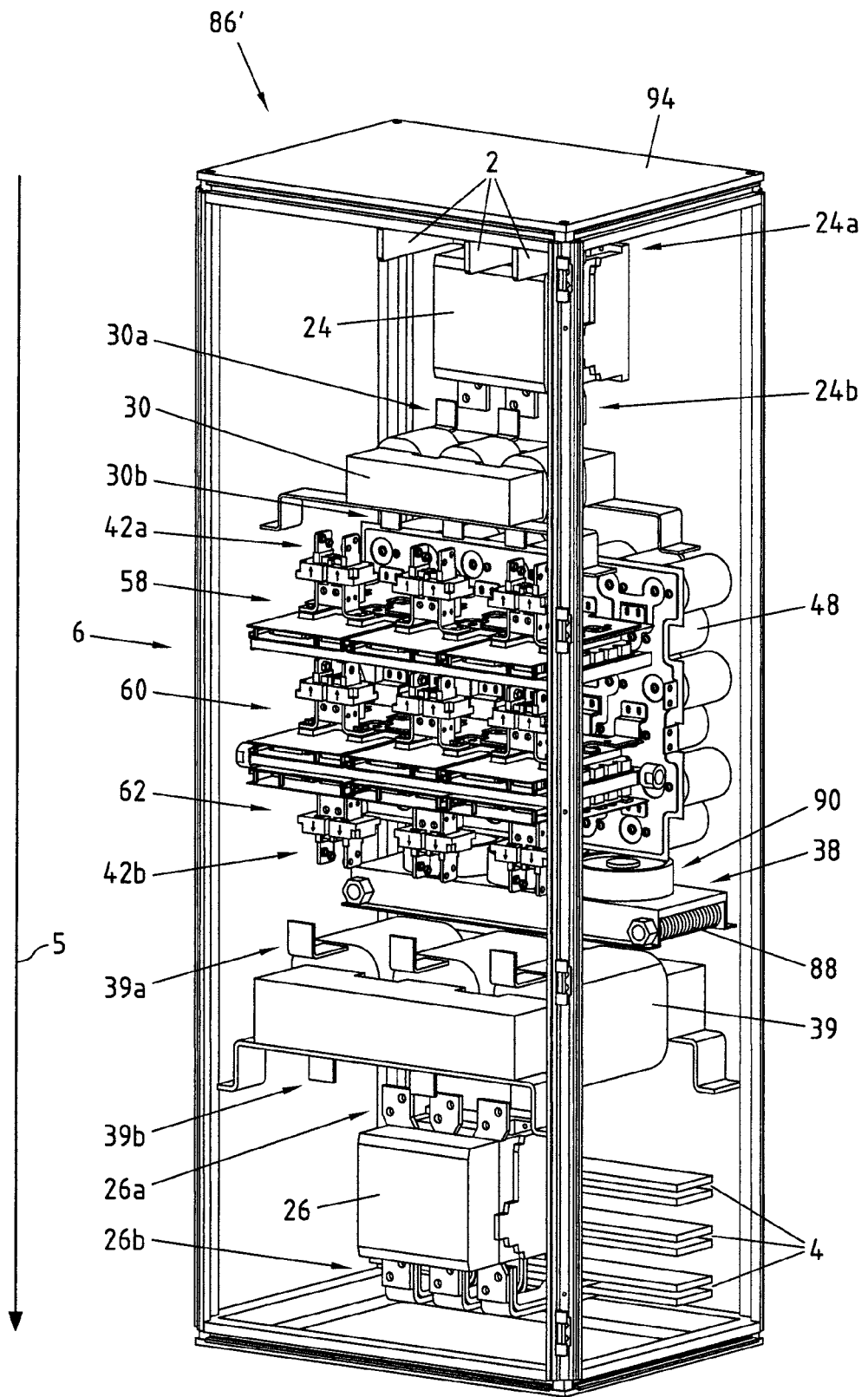
FIG. 8 a perspective representation of a further exemplary embodiment of a power switch cabinet according to the invention.

FIG. 8 is a perspective representation of a further exemplary embodiment of a power switch cabinet 86' according to the invention, similar to the power switch cabinet 86 from FIG. 7. The power switch cabinet 86' has as the mains and machine connections 2 and 4 AC rails that are each similarly designed for three-phase alternating current. The AC rails for the mains connection 4 are again arranged horizontally one above the other, while the AC rails for the machine connection 2 are vertically arranged alongside one another. The AC rails for the machine connection 2 of the power switch cabinet 86' this time run in the direction from the front to the back of the power switch cabinet 86' however. But other arrangements are similarly conceivable. A contactor 26 is arranged in the area of the mains connection 4 and is connected with the connection 26b of the contactor. A further contactor is arranged below the machine connections 2 and connected with these via the connections 24a.

Above the mains connection 4 or the contactor 26 again a line choke 39 is integrated into the power switch cabinet 86', which can be connected via the connection 39b with the connection 26a of the contactor 26. Via the line choke a cooling device 38 is built in, which has an air-water heat exchanger 88 and fan 90. Here the line choke 39 can be water- or air-cooled. The module comprising the air-water heat exchanger 88 and the fan 90 arranged above this is in comparison with the power switch cabinet 86' designed to be less deep, however, and is arranged merely in the rear half of the power switch cabinet 86'. Above the fan 90 the power module 6 shown in FIG. 5 is arranged. Here the modules 58, 60, 62 are cooled by the water cooling circuit 92. Other embodiments of the power module can also be arranged here, however. The fans 90 are also arranged below the capacitors 48 of the direct voltage intermediate circuit, as a result of which the capacitor bank 48 of the power module 6 can continue to be effectively cooled by the fans 90. In the front area above the line choke 39 and below the mains converter 42 there is more space for the respective connections 39a and 42b, however.

Above the power module 6 again the dU/dt filter 30 is arranged, which similarly can be connected to the water cooling circuit 92. Via the connections 42a of the converter of the power module 6 this can be connected to the dU/dt filter. Above the dU/dt filter 30 the machine contactor 24 is arranged and on top of this the machine connection 2 in the form of AC rails. Here the connection 24b of the contactor 24 is connected with the connection 30a of the dU/dt filter 30.

It can be seen how the individual components, in particular the machine connection 2, the dU/dt filter 30, the power module 6 (consisting of the machine converter 8, the direct voltage intermediate circuit 12 and the mains converter 10), the line choke 39 and the mains connection 4, are arranged in the power switch cabinet 86' in the frame 94 substantially in series in a vertical arrangement in the direction of the power flow, shown by the arrow 5. A substantially horizontal arrangement or an arrangement in the reverse sequence is of course also conceivable. Through the arrangement in the stated sequence, which substantially corresponds to the direction of the power flow, the components can be arranged in a very compact and easily accessible manner in the power switch cabinet 86', whilst at the same time they can be adequately cooled.

It can be seen that the individual connections of the components are only a small distance apart, for example 24b with 30a, 30b with 42a, 42b with 39a and 39b with 26a, since through the arrangement of the components in the direction of the power flow part of the path in the power switch cabinet 86' is already bridged by the components themselves.

FIG. 9 shows various embodiments of a switch cabinet arrangement 96, 98, which can consist of power switch cabinets according to the invention. The switch cabinet arrangement 96 shows three switch cabinets 100, 102, 104 from above. Here the switch cabinets 100, 102 are arranged back-to-back, while the switch cabinet 104 is arranged laterally and transverse to the switch cabinets 100, 102. The switch cabinets 100, 102, 104 are in particular switch cabinets wherein preferably one of the switch cabinets 100, 102, 104 is also a mains connection switch cabinet. This arrangement is particularly advantageous in that the AC rails in the power switch cabinets 100 and 102 only have to be designed for the respective rated current. Only in the mains connection cabinet 104 are the AC rails joined together at the mains connection, so that only in this switch cabinet do the AC rails have to be designed for the sum of the rated currents of the two switch cabinets 100 and 102. This allows the costs of copper connections to be saved.

The switch cabinet arrangement 98 here shows four switch cabinets 100, 102, 104, 106 from above. The switch cabinets 100, 106 and 102, 104 are in each case arranged laterally side by side, while the switch cabinets 100, 102 and 106, 104 in each case are arranged back-to-back. The switch cabinets 100, 102, 104, 106 are in particular power switch cabinets wherein preferably one of the switch cabinets 100, 102, 104, 106 is also a main connection switch cabinet.

Other geometrical arrangements of the switch cabinets are of course also conceivable, in particular lateral arrangements in series or arrangements with one on top of the other or arrangements with less than three or more than 4 switch cabinets.

It is clear to see that through the switch cabinet arrangements 96, 98 a space-saving arrangement is possible, wherein simultaneously easy access to the components of each switch cabinet is possible from the fronts 100', 102', 104', 106'. For the corresponding arrangements only the mains and machine connections 2, 4 have to be arranged such that the corresponding arrangement is possible.

Figure 10:
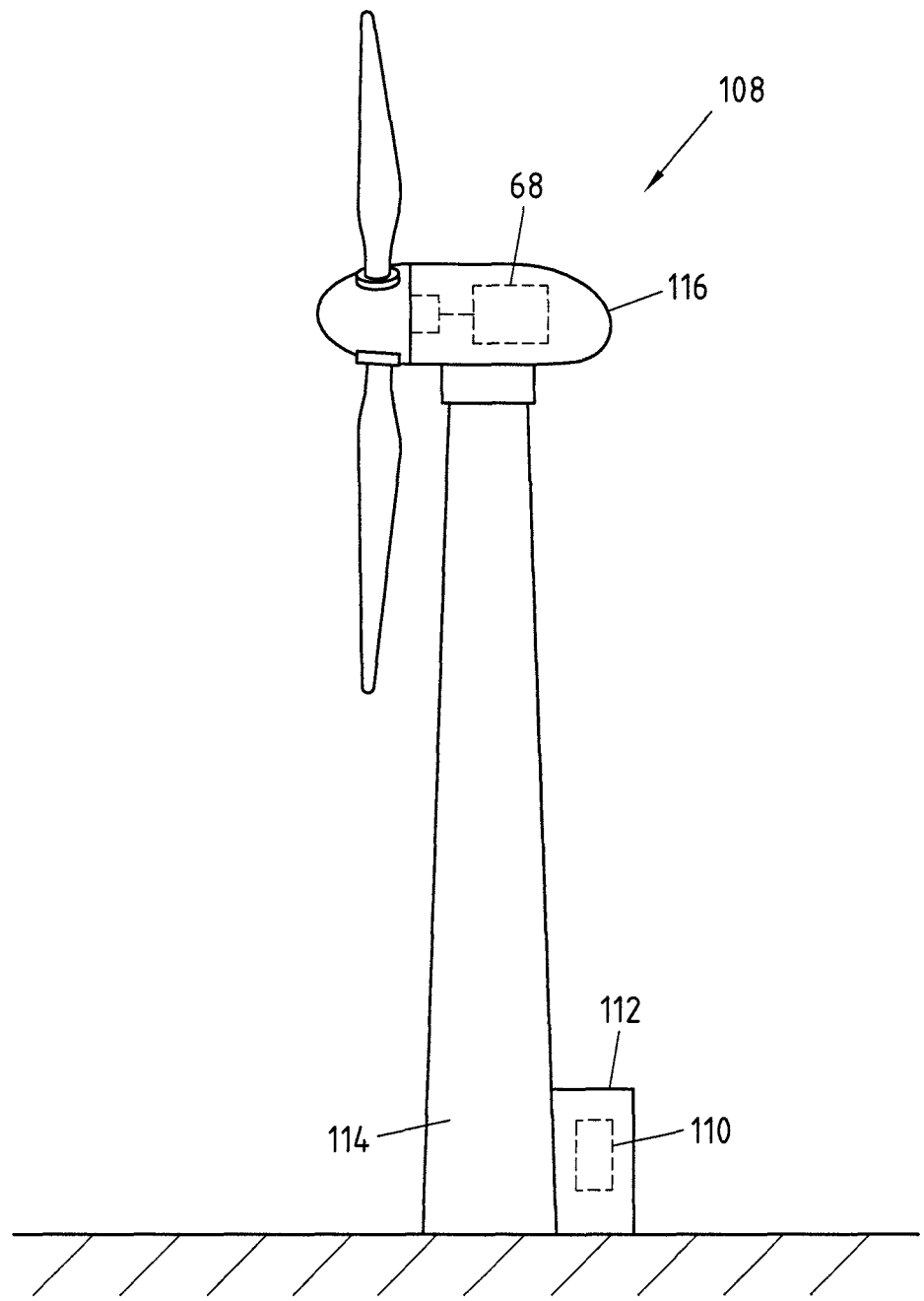
FIG. 10 a schematic representation of an exemplary embodiment of a wind turbine with a switch cabinet arrangement.

FIG. 10 is now a schematic representation of a wind turbine 108 with a switch cabinet arrangement 110 according to the invention. This can, for example, be designed like the switch cabinet arrangements 64, 96 or 98. The switch cabinet arrangement 110 is mounted in a housing 112 at the foot of the wind turbine 108. The switch cabinet arrangement 110 can, however, also be arranged inside the tower 114 or in the vicinity of the generator 68, thus for example in the nacelle 116 of the wind turbine 108. Because of the small amount of space available in wind turbines, in particular in the nacelle 116 and in the tower 114, and the necessary adaptation of the wind turbines 108 to various power ranges the use of the power switch cabinet arrangement 110 according to the invention for wind turbines 108 is particularly advantageous. However, just a single power switch cabinet 1, 1', 1", 36, 86 or 86' can also be provided instead of the switch cabinet arrangement 110. This is in particular the case with double-fed asynchronous generators in which only part of the power has to be passed through the converters.

The invention claimed is:

1. Power switch cabinet of a device for producing electric energy, wherein the power switch cabinet comprises
    a machine connection,
    a power module and
    a mains connection,
    wherein the power module has
    a machine converter,
    a mains converter,
    a direct voltage intermediate circuit and
    a chopper,
    and the arrangement of the components substantially corresponds to the direction of the power flow.

2. Power switch cabinet according to claim 1, wherein the power switch cabinet further has a decentralised control unit.

3. Power switch cabinet according to claim 1, wherein the components are arranged substantially linearly in the sequence of:
    machine connection,
    machine converter,
    direct voltage intermediate circuit with chopper,
    mains converter, and
    mains connection.

4. Power switch cabinet according to claim 1, wherein the components are arranged substantially in the vertical direction, in particular from top to bottom.

5. Power switch cabinet according to claim 1, wherein the power switch cabinet is connected via associated secondary windings of one or a plurality of transformers to the mains.

6. Power switch cabinet according to claim 1, wherein the power module has a plate-shaped direct current bus bar, which on a first side has power switches and a chopper and on a second side capacitors of the direct voltage intermediate circuit.

7. Power switch cabinet according to claim 1, wherein the power switch cabinet has a dU/dt filter.

8. Power switch cabinet according to claim 1, wherein the power switch cabinet has a line choke.

9. Power switch cabinet according to claim 1, wherein the power switch cabinet upstream of the mains connections and/or the machine connections, has devices for electrical isolation of the power switch cabinet.

10. Power switch cabinet according to claim 1, wherein the power switch cabinet has a current and/or voltage limitation device.

11. Power switch cabinet according to claim 1, wherein the power switch cabinet has an emergency power supply.

12. Power switch cabinet according to claim 1, wherein the power switch cabinet has a cooling device, in particular a heat exchanger.

13. Power switch cabinet according to claim 12, wherein the cooling device has a heat-pipe.

14. Power switch cabinet according to claim 12, wherein the cooling device has at least one fan arranged directly below the capacitors of the direct voltage intermediate circuit.

15. Power switch cabinet according to claim 1, wherein the power switch cabinet is hermetically sealed from the ambient air.

16. Device for producing electric energy, wherein the device comprises a power switch cabinet according to claim 1.

17. Device for producing electric energy according to claim 16, wherein the device is designed as a wind turbine with a generator, in particular as a wind turbine of an offshore wind farm.

* * * * *